(12) United States Patent
Fuhrmann et al.

(10) Patent No.: US 8,397,192 B2
(45) Date of Patent: Mar. 12, 2013

(54) PROOF BASED BOUNDED MODEL CHECKING

(75) Inventors: Oded Fuhrmann, Zichron Yaakov (IL); Alexander Ivrii, Haifa (IL); Tatyana Veksler, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/447,221

(22) Filed: Apr. 15, 2012

(65) Prior Publication Data

US 2012/0198400 A1 Aug. 2, 2012

Related U.S. Application Data

(63) Continuation of application No. 12/857,588, filed on Aug. 17, 2010, now Pat. No. 8,201,116.

(51) Int. Cl.
*G06F 17/50* (2006.01)
(52) U.S. Cl. ...................................................... 716/106
(58) Field of Classification Search .................... 716/106
See application file for complete search history.

(56) References Cited

U.S. PATENT DOCUMENTS

| 7,290,230 B2 * | 10/2007 | Prasad | 716/106 |
| 7,406,405 B2 * | 7/2008 | McMillan et al. | 703/2 |
| 7,448,005 B2 * | 11/2008 | Baumgartner et al. | 716/106 |
| 7,742,907 B2 * | 6/2010 | Gupta et al. | 703/14 |
| 2004/0230407 A1 * | 11/2004 | Gupta et al. | 703/2 |
| 2010/0005454 A1 | 1/2010 | Sankaranarayanan et al. | |

OTHER PUBLICATIONS

Aarti Gupta, Malay K. Ganai, Zijiang Yang, Pranav Ashar, "Iterative Abstraction using SAT-based BMC with Proof Analysis", ICCAD 2003.
Kuntal Nanshi, Fabio Somenzi, "Guiding simulation with increasingly refined abstract traces", DAC 2006.
Bing Li, Chao Wang, Fabio Somenzi, "Abstraction refinement in symbolic model checking using satisfiability as the only decision procedure", STTT 7(2).
Nina Amla, Kenneth L. McMillan, "A Hybrid of Counterexample-Based and Proof-Based Abstraction". FMCAD 2004.
Bing Li, Fabio Somenzi, "Efficient Abstraction Refinement in Interpolation-Based Unbounded Model Checking". TACAS 2006.
Kenneth L. McMillan, Nina Amla, "Automatic Abstraction without Counterexamples". TACAS 2003.
Thomas A. Henzinger, Ranjit Jhala, Rupak Majumdar, Kenneth L. McMillan, "Abstractions from proofs". POPL 2004.
Anubhav Gupta, Ofer Strichman, "Abstraction Refinement for Bounded Model Checking". CAV 2005.

* cited by examiner

*Primary Examiner* — Stacy Whitmore
(74) *Attorney, Agent, or Firm* — Ziv Glazberg; Glazberg & Applbaum Co.

(57) ABSTRACT

An UNSAT core may be reused during iterations of a bounded model checking process. When increasing the bound, signals corresponding to signals within the UNSAT core may be used to represent the functionality of the model during cycles between the original bound and the increased bound. In case, consecutive unsatisfiability is determined in respect to different bounds, the same UNSAT core may be reused instead of computing a new UNSAT core.

20 Claims, 4 Drawing Sheets

PROOF BASED BOUNDED MODEL CHECKING

CROSS-REFERENCE TO RELATED APPLICATIONS

This application is a continuation and claims the benefit of U.S. non-provisional application Ser. No. 12/857,588 filed Aug. 17, 2010, which is hereby incorporated by reference in its entirety.

BACKGROUND

The present disclosure relates to model checking in general, and to bounded model checking using a proof of unsatisfiability provided by a SAT solver, in particular.

Computerized devices control almost every aspect of our life—from writing documents to controlling traffic lights. However, computerized devices are bug-prone, and thus require a testing phase in which the bugs should be discovered. The testing phase is considered one of the most difficult tasks in designing a computerized device. The cost of a bug may be enormous, as its consequences may be disastrous. For example, a bug may cause the injury of a person relying on the designated functionality of the computerized device. Additionally, a bug in hardware or firmware may be expensive to fix, as patching it requires call-back of the computerized device. Hence, many developers of computerized devices invest a substantial portion, such as 70%, of the development cycle to discover erroneous functionalities of the computerized device.

One technique used to find bugs is model checking. A model of the functionality of the computerized device and a set of one or more properties that should be held by the computerized device, also referred to as specification properties, may be utilized by a model checker to determine whether or not the computerized device upholds the specification properties. In some cases, the model represents a possible initial state of the computerized device, and a transition relation function between a state and a next state of the computerized device in a successive timeframe, cycle or other discrete unit representing a phase, generally referred to as a cycle. As the computerized device may operate in an unbounded number of cycles, and as the number of possible states may be large, some model checkers may use abstractions, reductions, symbolic representation of states and other methods to enable model checking of the model. In some cases, a bound on the number of cycles may be utilized, such as to enable proving that the model, and therefore the computerized device, holds the specification property within the bound. Such model checkers are referred to as Bounded Model Checkers (BMCs).

Some BMCs encode a formula representative of a state of the model in all bounded models. An exemplary formula may be $$I \wedge \prod_{i=1 \ldots K} TR_i \wedge \neg P,$$

where I is the initial state(s), $TR_i$ is a transition relation between state of cycle i−1 and state of cycle i, K is the bound on the number of cycles, $$\prod_{i=1 \ldots K} TR_i$$

is a conjunction of all the transition relations between cycle 0 until the bound, and ¬P is the negation of the at least one specification property in respect to variables of state K (also referred to as signals), in respect to variables of all states up to state K, and the like. It is clear that if there exists a state that contradicts the specification property, there will be a satisfying assignment to the formula (i.e., an assignment to all variables of the formula that holds the formula to be TRUE). On the other hand, if the formula is unsatisfiable (i.e., any combination of values to the variables yields the formula to be FALSE), then the bounded model is verified in respect to the specification property.

As is known in the art, a SAT solver may be utilized to determine satisfiability of a formula, such as given in a Conjunctive Normal Form (CNF). For unsatisfiable formulas, the SAT solver may provide a proof of unsatisfiability which comprises of clauses of the CNF (and/or that may be deduced from the CNF) that are already unsatisfiable. A proof of unsatisfiability is a direct acyclic graph. The graph is comprised of a root, intermediate nodes and leaves. The leaves are a portion of the clauses of the CNF. The root of the proof is an empty clause. The intermediate nodes are clauses that are implied by respective parent nodes. For example, an intermediate node may have two parent nodes, from which the intermediate node is obtained by a resolution. An UNSAT core of an unsatisfiable set of clauses is an unsatisfiable subset of theses clauses. An UNSAT core may be determined based on a proof of unsatisfiability, as the proof formally deduces the empty root from a portion of the formula. In this case, the leaves of a proof form an UNSAT core. An UNSAT core may be minimized by iteratively proving unsatisfiability of a previously determined UNSAT core and obtaining a new UNSAT core from the new proof until a fixed-point is reached.

The proof or UNSAT core may be utilized in many model checking related applications, such as for example, in proof-based abstraction-refinement, interpolation and the like.

BRIEF SUMMARY

One exemplary embodiment of the disclosed subject matter is a computer-implemented method for performing bounded model checking to a model in respect to a specification property, the method being performed by a computer including a processor and a memory, the method comprising: obtaining a UNSAT core of a first function from the memory, the first function being unsatisfiable if and only if the model holds the specification property within a first bound, wherein the UNSAT core is a portion of the first function that is unsatisfiable; calculating a second bound, the second bound is larger than the first bound; defining a second function based on the first function and based on the UNSAT core of the first function, the second function being unsatisfiable if and only if the model holds the specification property within the second bound; determining that the second function is unsatisfiable; calculating a third bound, the third bound is larger than the second bound based on the second function and based on the UNSAT core of the first function; and defining a third function, wherein the third function is unsatisfiable if and only if the model holds the specification property within the third bound, wherein the third function is defined based on the UNSAT core of the first function.

Another exemplary embodiment of the disclosed subject matter is a computerized apparatus for performing bounded model checking to a model in respect to a specification property, the computerized apparatus having a processor, the computerized apparatus comprising: a receiver configured to receive the model and the specification property; a bound determinator configured to determine a bound on a number of cycles of the model; a function refining module configured to modify an abstract function in response to a determination of a satisfying assignment of the abstract function, the satisfying assignment is not in accordance with the model; a memory configured to retain one or more UNSAT cores of functions, wherein an UNSAT core of a function is a portion of the function that is unsatisfiable; a function determinator configured to determine a function, the function being unsatisfiable if and only if the model holds the specification property within the bound, wherein the function determinator is configured to utilize an UNSAT core retained in the memory; and a satisfiability solver configured to determine whether the function is satisfiable or unsatisfiable, the satisfiability solver comprising: an UNSAT core reuse module configured to determine whether to use the UNSAT core retained in the memory as an UNSAT core of the function; and an UNSAT core calculator configured to determine a new UNSAT core of the function in response to a determination not to reuse the UNSAT core retained in the memory.

Yet another exemplary embodiment of the disclosed subject matter is a computer program product for performing bounded model checking to a model in respect to a specification property, the computer program product comprising: a non-transitory computer readable medium; a first program instruction for obtaining a UNSAT core of a first function from the memory, the first function being unsatisfiable if and only if the model holds the specification property within a first bound, wherein the UNSAT core is a portion of the first function that is unsatisfiable; a second program instruction for calculating a second bound, the second bound is larger than the first bound; a third program instruction for defining a second function based on the first function and based on the UNSAT core of the first function, the second function being unsatisfiable if and only if the model holds the specification property within the second bound; a fourth program instruction for determining that the second function is unsatisfiable; a fifth program instruction for calculating a third bound, the third bound is larger than the second bound based on the second function and based on the UNSAT core of the first function; a sixth program instruction for defining a third function, wherein the third function is unsatisfiable if and only if the model holds the specification property within the third bound, wherein the third function is defined based on the UNSAT core of the first function; and wherein the first, second, third, fourth, fifth and sixth program instructions are stored on the non-transitory computer readable medium.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
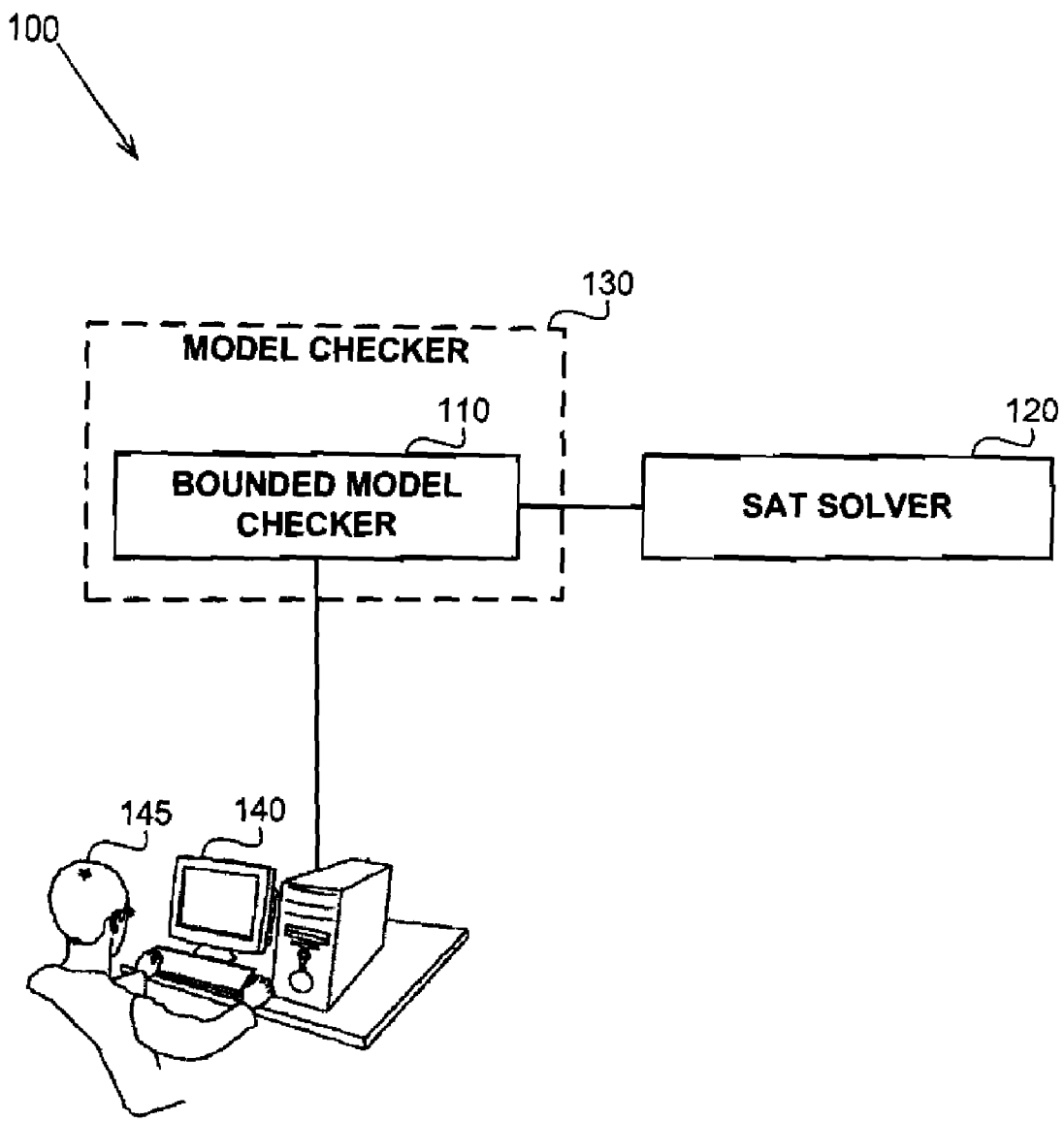
FIG. 1 shows a computerized environment in which the disclosed subject matter is used, in accordance with some exemplary embodiments of the subject matter.

The disclosed subject matter is described below with reference to flowchart illustrations and/or block diagrams of methods, apparatus (systems) and computer program products according to embodiments of the subject matter. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

One technical problem dealt with by the disclosed subject matter is to enable a method to perform bounded model checking. Another technical problem is to perform bounded model checking using a SAT solver. Yet another technical problem is to perform proof-based bounded model checking using an UNSAT core provided by the SAT solver.

One technical solution is to reuse an UNSAT core provided by the SAT solver. In some exemplary embodiments, whenever a formula of type described in [0004] is unsatisfiable, in particular implying that the specification property holds up to the current verification cycle K, the UNSAT core may be obtained from the SAT solver based on a proof of unsatisfiability. The UNSAT core may be minimized The UNSAT core is used for adding signals in the model in cycles after the original bound. The UNSAT core may be used by identifying signals that are deemed to cause the formula to be unsatisfiable (e.g., signals appearing in the UNSAT core), and to add corresponding signals in the added cycles. The UNSAT core may be said to be used to abstract the model on the cycles after the original bound. A determination whether or not to reuse the UNSAT core computed for a previous specification cycle or to compute a new one may be performed based on an indication that the proof (or the set of signals required for unsatisfiability, as provided in the proof) is likely to be substantially modified if recomputed. For example, the new UNSAT core is likely to be substantially modified in case the bounded model was refined after the previous UNSAT core was determined.

One technical effect of utilizing the disclosed subject matter is reducing redundant computation time, by avoiding proof computations which may be a relatively resource-consuming task. SAT solving and proof computations are considered resource-consuming tasks, that may require, in some circumstances, long time (such as for example one hour, a dozen hours, or the like) to be completed and may require a substantial amount of memory to be used (such as, for example, 10 GB of RAM memory or the like). Another technical effect is to utilize an observation that in practice, a set of signals that are important for unsatisfiability appearing within an UNSAT core tend to be stable over long cycle ranges. The stable feature of the UNSAT core is that substantially the same set of signals provides justification for the formula being unsatisfiable, or in other words—the specification property being held in the bounded model. Once the bounded model is refined, the UNSAT core is likely to be substantially modified and introduce different set of signals that justify unsatisfiability.

Referring now to FIG. 1 showing a computerized environment in which the disclosed subject matter is used, in accordance with some exemplary embodiments of the subject matter.

A computerized environment 100 may comprise a Bounded Model Checker (BMC) 110. The BMC 110 may be configured to determine whether a model (not shown) holds a specification property (not shown) during a bounded number of cycles of the model. The model may represent a target system (not shown), such as a circuit, a software, a protocol or the like. The model may be defined using descriptive language, such as EDL, SystemC, Java or the like. The specification property may be defined using a logic language, such as PSL/Sugar, SVA or the like. The specification property may be a safety specification property, such as AGp (i.e., all states of the model hold the specification p), a liveness specification property, such as EGp (i.e., eventually there is a state the holds the specification p), a bounded liveness, such as A next[1 ... n] p (i.e., within the next n states, there is a state that holds the specification p) or the like.

The BMC 110 may be configured to increase the bound in response to a determination that the model holds the specification property during the original bound. The BMC 110 may utilize a proof-based abstraction of the model in respect to the increased bound.

In some exemplary embodiments, the BMC 110 may utilize a SAT solver 120, such as Chaff™ of the Princeton University, New Jersey, United States, the open source Mini-Sat™ or the like. The SAT solver 120 is configured to solve a Boolean satisfiability problem. The Boolean satisfiability problem comprises a formula, which may be presented in a Conjunctive Normal Form (CNF), which is either satisfiable or not. The SAT solver 120 may be configured to find a satisfying assignment (a SAT) or determine that the Boolean satisfiability problem is unsatisfiable (an UNSAT).

In some exemplary embodiments, the SAT solver 120 may be configured to provide a proof of unsatisfiability of the Boolean satisfiability problem. Based upon the proof, an UNSAT may be determined. The UNSAT may be a set of clauses that cause the CNF to be unsatisfiable. The UNSAT core may comprise redundant clauses, such as clauses that may be removed without causing the UNSAT core to be invalidated (e.g., being satisfiable).

Consider the following CNF as an example: (b)∧(a)∧(a ∨ b)∧(¬a)∧(c ∨ d ∨ e ∨ f ∨ g ∨ h). One UNSAT core may be: (b)∧(a)∧(a ∨ b)∧(¬a). Another UNSAT core may be: (a ∨ b) ∧(a)∧(¬a). In some exemplary embodiments, the SAT solver may minimize the UNSAT core by proving iteratively that the UNSAT core is unsatisfiable and comparing a new UNSAT core with the UNSAT core. Once the UNSAT core and the new UNSAT core are the same, a minimized UNSAT core is determined. In some exemplary embodiments, the minimized UNSAT core may not be the minimal UNSAT core available; the minimized UNSAT core may comprise redundant clauses; there may exist a smaller UNSAT core than the minimized UNSAT core comprising different clauses and the like.

In some exemplary embodiments, the SAT solver 120 may be an incremental SAT solver, utilizing a previous execution to determine satisfiability of a current function. Incremental SAT may be useful in SAT-based model checking as the prefix of the CNF remains substantially the same (The prefix $$I \wedge \prod_{i=1 \ldots PK} TR_i,$$

where PK is the bound during the previous execution, may remain unchanged).

In some exemplary embodiments, a model checker 130 may utilize the BMC 110 to perform unbounded model checking. In some exemplary embodiments, the model checker 130 may perform abstraction-refinement based model checking. In some exemplary embodiments, the model checker 130 may perform SAT-based interpolation. Other model checking techniques which utilize bounded model checking may be performed.

In some exemplary embodiments, a user 145 may be provided with indications from the BMC 110. The user 145 may be a verification engineer, a developer of the target system, a QA staff member or the like. The user 145 may utilize a terminal 140 or other man-machine interface to provide the BMC 110 with parameters, rules and configurations. The user 145 may provide the specification property, the model, an initial bound, an increment of the bound upon proof of validity during the bound, and the like. The user 145 may utilize the terminal 140 to review output from the BMC 110, such as log activity, indication of SAT or UNSAT, a counter-example refuting the property specification, indication of the specification property being verified or refuted, and the like.

In some exemplary embodiments, the user 145 may further provide input and review output associated with the model checker 130 and/or the SAT solver 120.

In some exemplary embodiments, the BMC 110 is a software product executed by a general-purpose computer, a server or the like. In some exemplary embodiments, the model checker 130 is a software product executed by the same or a different computer. In some exemplary embodiments, the SAT solver 120 is a software product executed by the same or a different computer.

Figure 2:
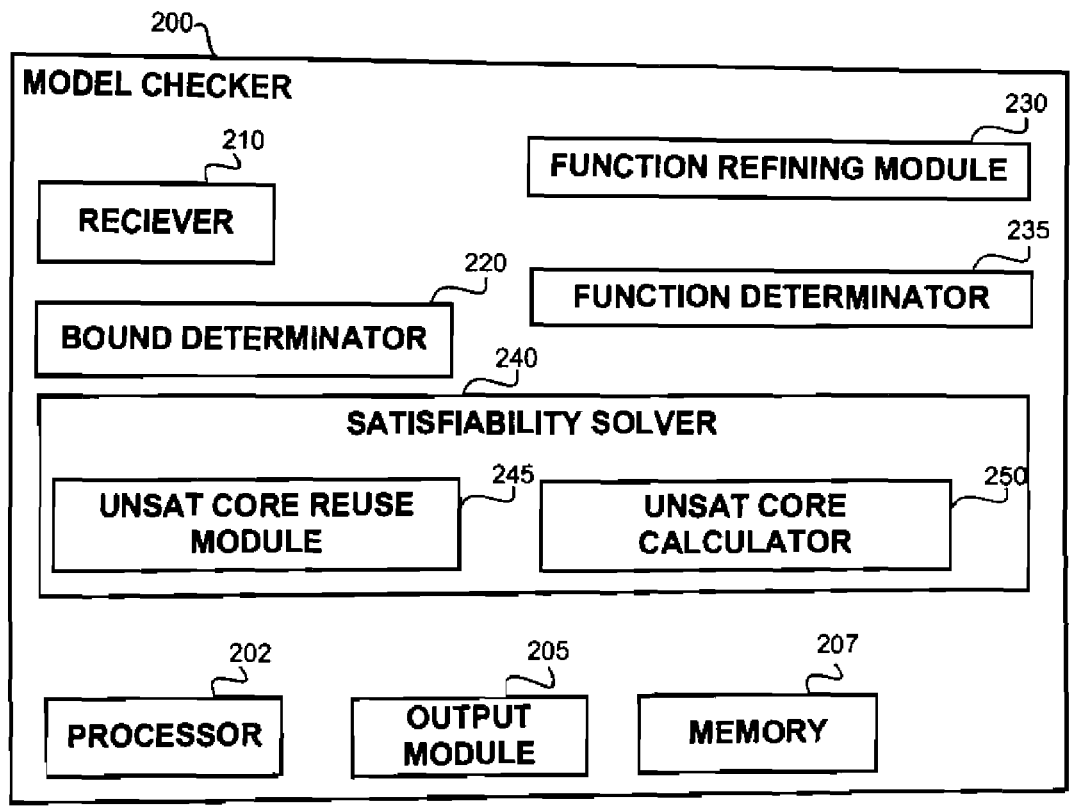
FIG. 2 shows a block diagram of a model checker, in accordance with some exemplary embodiments of the disclosed subject matter.

Referring now to FIG. 2 showing a model checking in accordance with some exemplary embodiments of the disclosed subject matter. A model checker 200, such as 130 of FIG. 1, may be configured to determine whether or not a specification property is held by a model. The model checker 200 may be a BMC, such as 110 of FIG. 1, or may utilize bounded model checking to determine a result for unbounded model checking.

In some exemplary embodiments, a receiver 210 may be configured to receive the model and the specification property. The receiver 210 may utilize a file system, a computerized network, an input device such as for example a keyboard, or the like in order to receive the model and/or the specification property.

In some exemplary embodiments, a bound determinator 220 may be configured to determine a bound on the model. The bound may be determined based on an initial bound, an initial bound provided by a user, such as 145 of FIG. 1, or the like. In some exemplary embodiments, the bound determinator 220 may determine a bound based on a previous bound. For example, in response to a determination that the model is verified under a first bound, the bound determinator 220 may determine a second bound that is larger than the first bound, such as the first bound incremented by a positive number. In some exemplary embodiments, an explicit bound may be computed based on the model and/or property, such that if the model holds the property up to the explicit bound, then it holds for the unbounded model as well.

In some exemplary embodiments, a function refining module 230 may be configured to modify an abstract function in response to a spurious counter example. A spurious counter example, also referred to as a spurious assignment, is a satisfying assignment of the abstract function that is not a satisfying assignment of the corresponding (unabstracted) function. The function refining module 230 may refine a model based on a spurious counter example detected in association with the abstract model. The function refining module 230 may perform counter-example guided abstracted refinement, utilize ternary simulation, justification algorithm or the like.

In some exemplary embodiments, the model checker 200 may comprise a function determinator 235. The function determinator 235 may be configured to determine a function representative of a functionality of the model during a bound. The function may be defined such as to be unsatisfiable if and only if the model holds the specification property during the bound. In some cases, the function may be satisfiable by a satisfying assignment which corresponds to a bug or be a spurious assignment that is not in accordance with the model. The spurious assignment may be an outcome of an abstraction of the model represented by the function, such as for example by omitting signals from being used in the function.

In some exemplary embodiments, the model checker 200 may comprise, or otherwise utilize, a satisfiability solver 240, also referred to as a SAT solver, such as 120 of FIG. 1. The SAT solver 240 may be configured to determine a SAT or an UNSAT in respect to the function. In case of a SAT, the SAT solver 240 may optionally provide a satisfying assignment. In case of an UNSAT, the SAT solver 240 may optionally provide a proof of unsatisfiability or an UNSAT core based thereof.

In some exemplary embodiments, the SAT solver 240 may comprise an UNSAT core proof calculator 250. The UNSAT core proof calculator 250 may be configured to provide an UNSAT core. In some exemplary embodiments, the unsatisfiability proof calculator 250 may utilize an implication graph, such as a proof of unsatisfiability, determined by the SAT solver 240 during analysis of the satisfiability of the formula. Based on the implication graph, the UNSAT core may be extracted or derived. Other methods known in the art may be used to determine the UNSAT core. In some exemplary embodiments, the UNSAT core calculator 250 may determine a minimized UNSAT core. In one exemplary embodiment, the UNSAT core calculator 250 may iteratively determine an UNSAT core of a previously determined UNSAT core until a minimized UNSAT core is determined.

In some exemplary embodiments, an UNSAT core reuse module 245 may be configured to determine whether to reuse a UNSAT core or calculate a new UNSAT core using the UNSAT core calculator 250. The UNSAT core reuse module 245 may be configured to determine to reuse the UNSAT core in case the model (and corresponding function) was not refined or otherwise modified after the UNSAT core was calculated. In case the model was modified, such as to include additional signals, the previously calculated UNSAT core may be not relevant. In case the model was not modified (except for an increase in the bound), the same UNSAT core may be reused. In some exemplary embodiments, UNSAT cores may be stable over different bounds, and therefore recalculation of the UNSAT core may be omitted as long as the model is not substantially modified.

In some exemplary embodiments, by utilizing the UNSAT core reuse module 245, a reduction in processing activities may be gained. The UNSAT core reuse module 245 may enable reuse of the same UNSAT core over different bounds as long as the SAT solver 240 provides for an UNSAT. Once the SAT solver 240 provides a SAT, and assuming a spurious assignment, the next time an UNSAT is determined, it is based on a refined model, and a new UNSAT core may be calculated.

In some exemplary embodiments, the SAT solver 240 may utilize the UNSAT core reuse module 245 prior to determining satisfiability of a formula. This may be done in order to reduce overhead of the SAT solver 240 by letting the SAT solver 240 know in advance not to retain information useful for extraction of a proof later on. For example, the implication graph may be partially retained and portions of the implication graph may be omitted during determination of satisfiability.

In some exemplary embodiments, the model checker 200 may comprise a processor 202. The processor 202 may be a Central Processing Unit (CPU), a microprocessor, an electronic circuit, an Integrated Circuit (IC) or the like. The processor 202 may be utilized to perform computations required by the model checker 200 or any of it subcomponents.

In some exemplary embodiments of the disclosed subject matter, the model checker 200 may comprise an output module 205. The output module 205 may be utilized to provide output to a user, such as 145 of FIG. 1. The output module 205 may be used to print a log file, display a SAT/UNSAT indication, display spurious/non-spurious bug indication, indicate a bound being utilized and the like.

In some exemplary embodiments, the model checker 200 may comprise a memory 207, such as a Random Access Memory (RAM), a Hard Disk, a Flash Drive, a storage server or the like. The memory 207 may be utilized by the model checker 200 for retaining information during operation of the model checker 200, such as retaining an UNSAT core determined by the UNSAT core calculator 250, retaining a proof of unsatisfiability determined by the satisfiability solver 240, retaining the bound determined by the bound determinator 220, retaining the model and specification property received by the receiver 210, retaining the refined function defined by the function refining module 230, retaining the function defined by the function determinator 235, retaining a flag indicator of whether the function refining module 230 was utilized, retaining implication graph utilized by the SAT solver 240, and the like.

Figure 3:
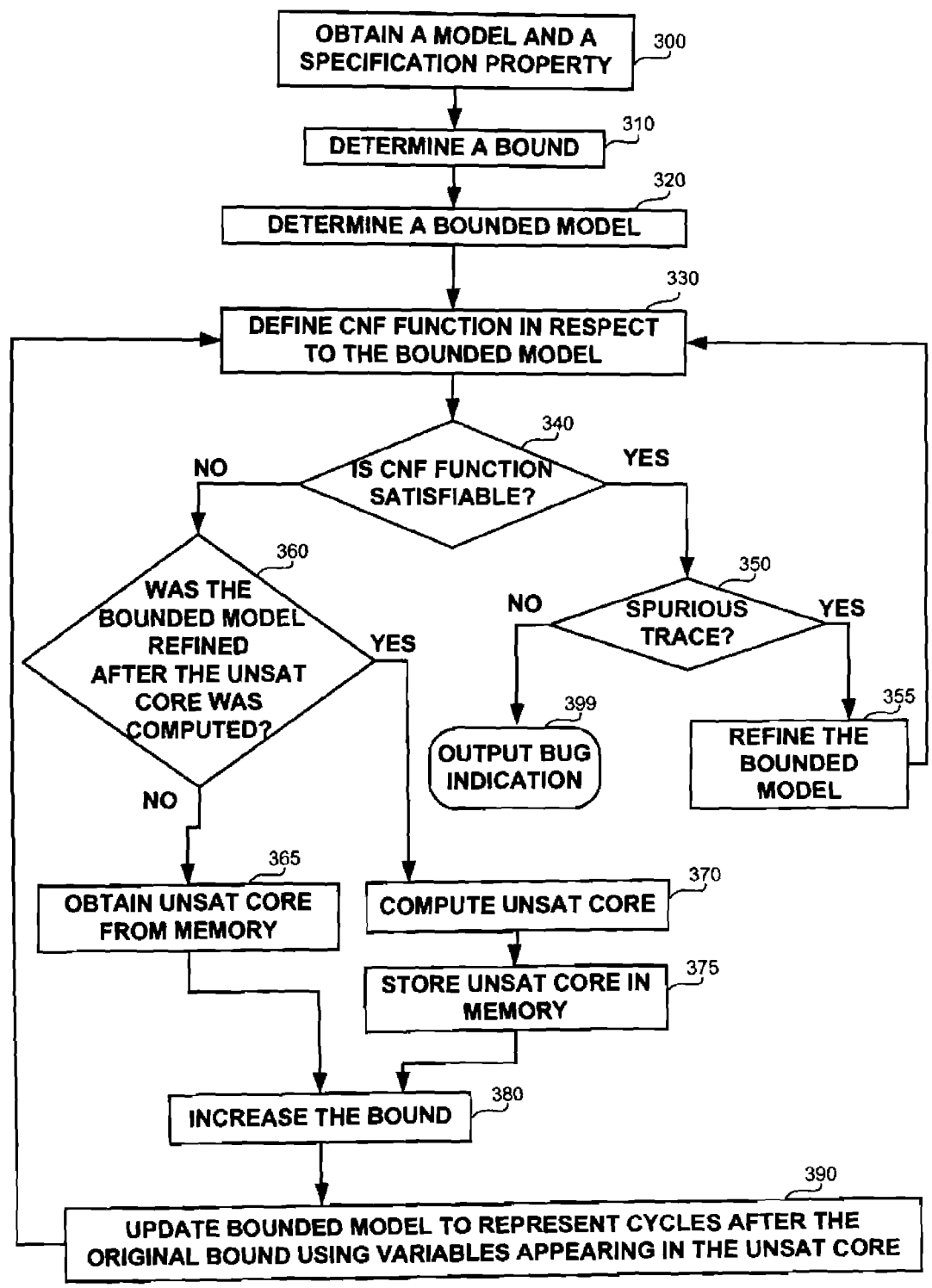
FIG. 3 shows a flowchart diagram of a method, in accordance with some exemplary embodiments of the disclosed subject matter.

Referring now to FIG. 3 showing a flowchart diagram of a method in accordance with some exemplary embodiments of the disclosed subject matter.

In step 300, a model and a specification property may be obtained, such as, for example, by the receiver 210 of FIG. 2.

In step 310, an initial bound may be determined. The bound may be determined by the bound determinator 220 of FIG. 2.

In step 320, a bounded model may be determined based on the model and the bound. The bounded model may be determined by the model checker 200 of FIG. 2.

In step 330, a function may be defined in respect to the current abstraction of the bounded model. The function may be defined based on the bounded model and the specification property. The formula may be a CNF. The formula may be of the form:

$$I \wedge \prod_{i=1 \ldots K} TR_i \wedge \neg P.$$

The formula may be defined by a function determinator, such as 235 of FIG. 2.

In step 340, a determination whether the formula is satisfiable is performed. The determination may be performed by a SAT solver, such as 240 of FIG. 2.

In case there is a satisfying assignment to the formula, step 350 may be performed. In case the satisfying assignment provides for a true trace, step 399 is performed, and a SAT indication, which correlates to the model refuting the specification property (e.g., a bug) may be outputted using an output module, such as 205 of FIG. 2. In case the trace is spurious (i.e., the assignment is not in accordance with the (non-abstracted) model), step 355 may be performed.

In step 355, the bounded model may be refined. The refined model may exclude the spurious trace. The refinement may be performed by a function refining module, such as 230 of FIG. 2. In response to refining the bounded model, step 330 is performed and a new function may be defined. The new function may be defined by the function refinement module 230, by the function determinator 235 or the like.

In response to a determination in step 340 that the function is unsatisfiable, step 360 may be performed. In step 360, a determination whether to reuse an old UNSAT core or compute a new UNSAT core may be performed. The determination may be based on when the bounded model was last refined. In case the model was refined after the old UNSAT core was calculated, a new UNSAT core may be calculated. Otherwise, the old UNSAT core may be reused. The determination in step 360 may be performed by an UNSAT core reuse module, such as 245 of FIG. 2.

In step 370, an UNSAT core may be computed. The UNSAT core may be computed by an UNSAT core calculator, such as 250 of FIG. 2.

In step 375, the UNSAT core may be stored in a memory, such as 207 of FIG. 2.

In case an old UNSAT core is reused, it may be obtained in step 365. The

UNSAT core may be obtained from the memory.

In step 380, the bound may be increased. The bound may be incremented by a constant number, such as five cycles, a random positive number, based on user's input and predetermined rules, or the like. The bound may be determined by a bound determinator 220 of FIG. 2.

In step 390, the bounded model may be modified. The modified bounded model may further include a functionality of the model after the original bound and up until the new bound determined in step 380. The functionality may be defined using a portion of the signals of the model. The portion of the signals may be selected based on the UNSAT core, such as signals corresponding to signals appearing in the UNSAT core. The UNSAT core that is used may be the UNSAT core obtained in step 365 or in step 370.

In one exemplary embodiment of the disclosed subject matter, the method of FIG. 3 may be performed using the following program code:

```
N <= initial bound;
A <= { };
Calculate_Proof <= TRUE;
while true {
    result <= SAT (A[0,N]); #determine SAT of the abstract model
                           #up until the bound
    if (result == SAT) {
        if (is_spurious()) {
            A <= refine (A, M); #refine the abstract model based on
                                #the model
            Calculate_Proof <= TRUE;
        } else {
            Report "bug at cycle N";
        }
    } else {
        if (Calculate_Proof) {
            core <= compute_and_minimize_UNSAT_core();
            Calculate_Proof <= false;
        }
        Report "passed up to cycle N";
        N <= N+1;
        A <= A U core;
    }
}
```

As can be noted by the exemplary code for performing an exemplary embodiment of the disclosed subject matter, the abstract model (A) is increased using the core by an additional cycle (as the bound, N, is incremented by one). The determination whether or not to calculate the proof of the UNSAT is performed in respect to a flag indicator named "Calculate_Proof" which is turned to TRUE in response to a refinement of the abstract model.

Figure 4:
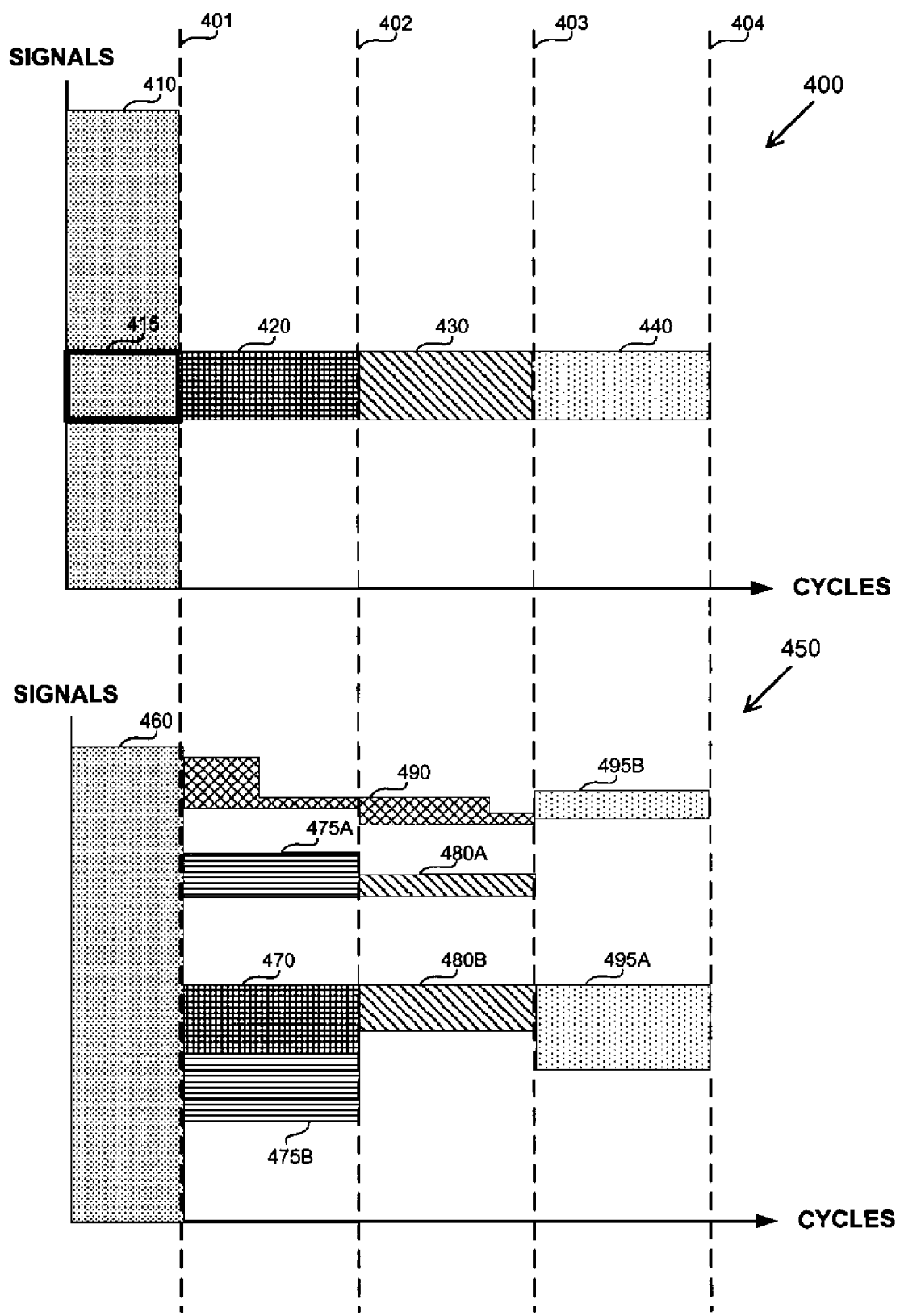
FIG. 4 shows charts of signals in cycles of the model used in a CNF, in accordance with some exemplary embodiments of the disclosed subject matter.

Referring now to FIG. 4 showing charts of signals in cycles of the model used in a CNF, in accordance with some exemplary embodiments of the disclosed subject matter.

A chart 400 shows signals of cycles that appear in a formula, such as a CNF. A state of a target system may be represented using signals. Values of the signals over different cycles may be represented by different instances of the signals, such as $i_1$, $i_2$, $i_3$ to represent the value of signal i over cycles one through three.

In accordance with some exemplary embodiments of the disclosed subject matter, at first, signals 410 are utilized in the formula for a first bound 401 on the cycles. The signals 410 may comprise a portion of the possible signals within the bound 401 (i.e., an abstraction of the bounded model), or all the possible signals within the bound 401 (i.e., the entire bounded model).

In response to a determination that the specification property is held during the first bound 401 (e.g., UNSAT is determined), an UNSAT core may be computed and signals within the UNSAT core may be identified. The signals utilized in the UNSAT core are a portion of the signals 410, denoted by 415. Based on the portion 415, a second formula may be defined in respect to a second bound 402. The second formula comprises signals 410 and 420. The signals 420 correspond to the portion 415.

In response to a determination that the specification property is held during the second bound 402 (e.g., UNSAT is determined), the bound 402 may be increased to a third bound 403. A third formula may be defined adding the signals 430 which also correspond to the portion 415. For the purpose of the disclosed subject matter, determining a proof that the specification property is held during the second bound 402, determining an UNSAT core or minimizing the UNSAT core may be omitted.

In a similar manner, signals 440 are utilized in a fourth function respective of a fourth bound 404. The signals are determined based on the UNSAT core determined in respect to the formula associated with the first bound 401. Determination of an UNSAT core, or minimization thereof, in respect to the third function may be omitted.

A chart 450 shows signals of cycles that appear in a formula. Chart 450 exemplifies one effect of a method in accordance with the disclosed subject matter where spurious assignments may be determined.

As with the chart 400, a functionality of the mode within the first bound 401 is represented by a first function that uses signals 460. In respect to an USNAT determination, an UNSAT core may be computed, and signals 470 may be determined to be used in respect to cycles between the first bound 401 and the second bound 402.

In response to a determination of a SAT for the second function, and a determination that the satisfying assignment is a spurious assignment, the bounded model is refined by further including signals 475A and 475B. A modified second function may be determined in respect to the second bound 402 and the refined bounded model.

In response to an UNSAT determination for the modified second function, the bound on the model may be increased to the third bound. However, the UNSAT core of the first function may not be used. Instead, the UNSAT core of the modified second function is computed and optionally minimized A third function may be therefore defined in respect to the third bound 403 to include signals 460, 470, 475A, 475B, 480A and 480B. The signals 480A and 480B may be determined based on the UNSAT core of the modified second function. As can be appreciated, at least a portion of the signals causing unsatisfiability (a portion of signals 475A) were not utilized in the original second function (which is, as mentioned above, satisfiable).

In response to a determination that the third function is satisfiable, and that the satisfying assignment is spurious, the bounded model may be refined again to further include signals 490. A modified third function associated with the third bound 403 may be defined to include signals 460, 470, 475A, 475B, 480A, 480B and 490.

In response to a determination that the modified third function is unsatisfiable, an UNSAT core may be computed and optionally minimized. Based on the proof, signals 495A and 495B may be used in a fourth function associated with the fourth bound 404.

In some exemplary embodiments, portions of signals that are used in a cycle may be scattered over the Y-axis of the chart, and not as presented in FIG. 4.

The charts 400 and 450 are presented as a didactic example only and should not be construed to limit the disclosed subject matter in any manner.

It will be noted that the UNSAT core may be utilized to identify signals whose behavior may be important for the unsatisfiability of the function (and therefore, for the property to hold). Such signals may be a portion of the signals in the UNSAT core, as there may be signals "on the free cut": the signals whose logic is not part of the unsatisfiability proof, but which appear in the UNSAT core because they appear inside logic of other signals that are important for the unsatisfiability of the function. The signals whose behavior may be important for unsatisfiability may be utilized by adding their defining logic in the additional cycles (between the previous bound and the current bound).

It will be noted that the UNSAT core may be utilized to identify set of clauses in the transition relation which participate in the UNSAT core. Such clauses may utilized by adding for the additional cycles only clauses associated with the set of clauses (i.e., shifted versions of the set of clauses).

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of program code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one skilled in the art, the disclosed subject matter may be embodied as a system, method or computer program product. Accordingly, the disclosed subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, and the like.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method performed by a computer comprising a processor and a memory, the method comprising:
    having a proof that a model holds a specification for a first bound;
    the computer using the proof to construct a first abstracted bounded model, wherein the first abstracted bounded model is bounded by a second bound, wherein the second bound is larger than the first bound;
    in response to a determination that the first abstracted bounded model holds the specification for the second bound, the computer reusing the proof to construct a second abstracted bounded model, wherein the second abstracted bounded model is bounded by a third bound, wherein the third bound is larger than the second bound; and
    whereby a second proof that the first abstracted bounded model holds the specification for the second bound is not computed.

2. The computer-implemented method of claim 1 further comprising the computer performing bounded model checking on the second abstracted bounded model.

3. The computer-implemented method of claim 1, whereby avoiding proof computation of the second proof reduces required computational resources of the processor.

4. The computer-implemented method of claim 1, wherein an UNSAT is extracted from the proof and used to construct the first and the second abstracted bounded models.

5. The computer-implemented method of claim 4, wherein the UNSAT core is a minimized UNSAT core.

6. The computer-implemented method of claim 4, wherein determining whether the model holds the specification for a predetermined bound is performed using a SAT solver, wherein the SAT solver determines a proof of unsatisfiability, and wherein the method further comprises extracting the UNSAT core from the proof of unsatisfiability.

7. The computer-implemented method of claim 1, wherein the determination that the first abstracted bounded model holds the specification for the second bound is performed by defining a Conjunctive Normal Form (CNF) function and determining that no satisfying assignment to the CNF function exists.

8. The computer-implemented method of claim 1, wherein the model is representative of states of a computerized device; and whereby the computerized device is verified to hold a specification property in every execution of a bounded version thereof.

9. The computer-implemented method of claim 1, comprising:
    iteratively performing SAT-based bounded model checking on an abstracted version of the model with respect to a bound, wherein in response to consecutive determinations that the abstracted versions of the model hold the specification for increasing bounds, reusing the proof for defining a new abstracted version of the model for a larger bound than the increasing bounds.

10. The computer-implemented method of claim 9, wherein in response to a determination that the abstracted version of the model does not hold the specification for a bound, performing proof-based abstraction refinement and stopping to reuse the proof for proof-based abstraction of the model.

11. A computerized apparatus having a processor and a memory, the processor being adapted to perform the steps of:
    having a proof that a model holds a specification for a first bound;
    using the proof to construct a first abstracted bounded model, wherein the first abstracted bounded model is bounded by a second bound, wherein the second bound is larger than the first bound;
    in response to a determination that the first abstracted bounded model holds the specification for the second bound, reusing the proof to construct a second abstracted bounded model, wherein the second abstracted bounded model is bounded by a third bound, wherein the third bound is larger than the second bound; and
    whereby a second proof that the first abstracted bounded model holds the specification for the second bound is not computed.

12. The computerized apparatus of claim 11 further comprising performing bounded model checking on the second abstracted bounded model.

13. The computerized apparatus of claim 11, whereby the processor is adapted to avoid proof computation of the second proof thereby reducing required computational resources of the processor.

14. The computerized apparatus of claim 11, wherein an UNSAT is extracted from the proof and used to construct the first and the second abstracted bounded models.

15. The computerized apparatus of claim 14, wherein the UNSAT core is a minimized UNSAT core.

16. The computerized apparatus of claim 14, wherein said processor is adapted to determine whether the model holds the specification for a predetermined bound by using a SAT solver, wherein the SAT solver is adapted to determine a proof of unsatisfiability, and wherein the processor is further adapted to extract the UNSAT core from the proof of unsatisfiability.

17. The computerized apparatus of claim 11, wherein the determination that the first abstracted bounded model holds the specification for the second bound is performed by defining a Conjunctive Normal Form (CNF) function and determining that no satisfying assignment to the CNF function exists.

18. The computerized apparatus of claim 11, wherein the model is representative of states of a computerized device; and whereby the computerized device is verified to hold a specification property in every execution in a bounded version thereof.

19. The computerized apparatus of claim 11, wherein the processor is adapted to:
iteratively perform SAT-based bounded model checking on an abstracted version of the model with respect to a bound; and
wherein in response to consecutive determinations that the abstracted versions of the model hold the specification for increasing bounds, the processor is adapted to reuse the proof for defining a new abstracted version of the model for a larger bound than the increasing bounds.

20. The computerized apparatus of claim 19, wherein in response to a determination that the abstracted version of the model does not hold the specification for a bound, the processor is adapted to perform proof-based abstraction refinement and stop reusing the proof for proof-based abstraction of the model.

* * * * *